United States Patent
Yang (10) Patent No.: US 10,963,335 B2
(45) Date of Patent: Mar. 30, 2021

(54) DATA STORAGE DEVICE AND ADAPTIVE DATA-READING METHOD THEREOF

(71) Applicant: Shannon Systems Ltd., Shanghai (CN)

(72) Inventor: Xueshi Yang, Shanghai (CN)

(73) Assignee: SHANNON SYSTEMS LTD., Shanghai (CN)

( * ) Notice: Subject to any disclaimer, the term of this patent is extended or adjusted under 35 U.S.C. 154(b) by 0 days.

(21) Appl. No.: 16/441,051

(22) Filed: Jun. 14, 2019

(65) Prior Publication Data
US 2020/0133767 A1 Apr. 30, 2020

(30) Foreign Application Priority Data
Oct. 25, 2018 (CN) .......................... 201811250388.5

(51) Int. Cl.
G06F 11/10 (2006.01)
H03M 13/11 (2006.01)
H03M 13/09 (2006.01)
G06F 11/14 (2006.01)
G06F 12/02 (2006.01)

(52) U.S. Cl.
CPC ...... *G06F 11/1012* (2013.01); *G06F 11/1052* (2013.01); *G06F 11/1402* (2013.01); *G06F 12/0246* (2013.01); *H03M 13/09* (2013.01); *H03M 13/1111* (2013.01); *G06F 2212/7207* (2013.01)

(58) Field of Classification Search
CPC ............. G06F 11/1012; G06F 11/1052; G06F 11/1402; G06F 12/0246; G06F 2212/7207; H03M 13/09; H03M 13/1111
See application file for complete search history.

(56) References Cited

U.S. PATENT DOCUMENTS

| | | | | |
|---|---|---|---|---|
| 9,563,502 B1* | 2/2017 | Alhussien | ........... | G11C 11/5642 |
| 9,633,740 B1* | 4/2017 | Alhussien | ............ | G11C 16/28 |
| 2013/0185612 A1* | 7/2013 | Lee | ........ | G11C 29/52 |
| | | | | 714/773 |
| 2017/0125090 A1* | 5/2017 | Zeng | ...................... | G11C 16/28 |

(Continued)

OTHER PUBLICATIONS

Y. Cai, S. Ghose, E. F. Haratsch, Y. Luo and O. Mutlu, "Error Characterization, Mitigation, and Recovery in Flash-Memory-Based Solid-State Drives," in Proceedings of the IEEE, vol. 105, No. 9, pp. 1666-1704, Sep. 2017. (Year: 2017).*

*Primary Examiner* — Kyle Vallecillo
(74) *Attorney, Agent, or Firm* — McClure, Qualey & Rodack, LLP (57) ABSTRACT

A data storage device is provided. The data storage device includes a flash memory and a controller. The flash memory includes a plurality of blocks for storing data and each block includes a plurality of pages. The controller is configured to convert a host read command into a read-operation instruction to the flash memory to perform a default read operation to read page data from the flash memory. The default read operation has a default read threshold voltage. In response to a failure of the default read operation, the controller is configured to sequentially perform a read operation on the flash memory using a read threshold voltage with respect to each entry of a plurality of entries in a read-retry table, and replace the default read threshold voltage with the read threshold voltage corresponding to the read operation being successfully performed.

18 Claims, 7 Drawing Sheets

(56) References Cited

U.S. PATENT DOCUMENTS

| | | | |
|---|---|---|---|
| 2018/0046527 A1* | 2/2018 | Reusswig | G06F 11/004 |
| 2018/0198619 A1* | 7/2018 | Zhang | H04L 9/3231 |
| 2018/0211713 A1* | 7/2018 | Zeng | G11C 16/26 |
| 2018/0342305 A1* | 11/2018 | Cha | G11C 16/26 |
| 2020/0035307 A1* | 1/2020 | Zeng | G11C 16/28 |

* cited by examiner

DATA STORAGE DEVICE AND ADAPTIVE DATA-READING METHOD THEREOF

CROSS REFERENCE TO RELATED APPLICATIONS

This application claims priority of China Patent Application No. 201811250388.5, filed on Oct. 25, 2018, the entirety of which is incorporated by reference herein.

BACKGROUND OF THE INVENTION

Field of the Invention

The present invention relates to data storage devices and, in particular, to a data storage device and an adaptive data-reading method thereof.

Description of the Related Art

Flash memory devices typically include NOR flash devices and NAND flash devices. NOR flash devices are random access—a host accessing a NOR flash device can provide the device any address on its address pins and immediately retrieve data stored in that address on the device's data pins. NAND flash devices, on the other hand, are not random access but serial access. It is not possible for NAND flash devices to access any random address in the way described above. Instead, the host has to write into the device a sequence of bytes which identifies both the type of command requested (e.g. read, write, erase, etc.) and the address to be used for that command. The address identifies a page (the smallest chunk of flash memory that can be written in a single operation) or a block (the smallest chunk of flash memory that can be erased in a single operation), and not a single byte or word. In reality, the NAND flash device always reads complete pages from the memory cells and writes complete pages to the memory cells. After a page of data is read from the array into a buffer inside the device, the host can access the data bytes or words one by one by serially clocking them out using a strobe signal.

The NAND flash device is made in a relatively small size, and the data retention, read disturbance, or other factors cause data to be difficult to be read out correctly. Accordingly, a data storage device and an adaptive data-reading method thereof are provided in the present invention to improve the efficiency for reading data.

BRIEF SUMMARY OF THE INVENTION

In an exemplary embodiment, a data storage device is provided. The data storage device includes a flash memory and a controller. The flash memory includes a plurality of blocks for storing data, each of the blocks comprising a plurality of pages. The controller is configured to receive a host read command from a host, and convert the host read command into a read-operation instruction to the flash memory to perform a default read operation to read page data from one of the pages of the flash memory. The default read operation has a configuration of a default read threshold voltage. In response to a failure of the default read operation, the controller is configured to sequentially perform a read operation on the flash memory using a configuration of a respective read threshold voltage corresponding to each entry of a plurality of entries in a read-retry table, and replace the configuration of the default read threshold voltage with the configuration of the read threshold voltage corresponding to the read operation being successfully performed In another exemplary embodiment, an adaptive data-reading method for use in a data-storage device is provided. The data storage device includes a flash memory having a plurality of blocks, and each of the blocks comprises a plurality of pages. The method includes the steps of: receiving a host read command from a host; converting the host read command into a read-operation instruction to the flash memory to perform a default read operation to read page data from one of the pages of the flash memory, wherein the default read operation has a configuration of a default read threshold voltage; and in response to a failure of the default read operation, sequentially performing a read operation on the flash memory using a configuration of a read threshold voltage corresponding to each entry of a plurality of entries in a read-retry table, and replacing the configuration of the default read threshold voltage with the configuration of the read threshold voltage corresponding to the read operation being successfully performed.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

The present invention will be described with respect to particular embodiments and with reference to certain drawings, but the invention is not limited thereto and is only limited by the claims. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

Figure 1:
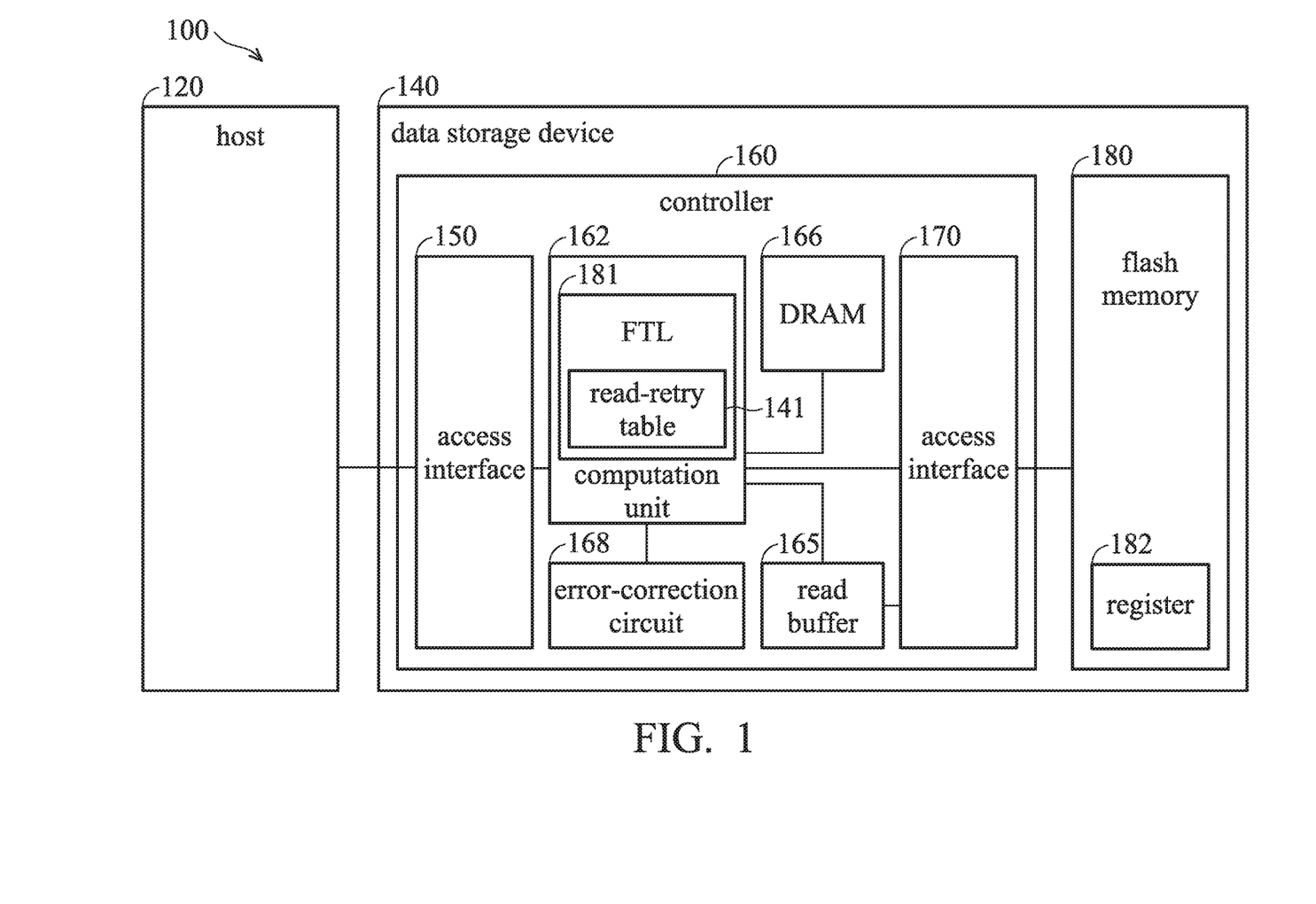
FIG. 1 is a block diagram of an electronic system in accordance with an embodiment of the invention.

FIG. 1 is a block diagram of an electronic system in accordance with an embodiment of the invention. The electronic system 100 may be a personal computer, a data server, a network-attached storage (NAS), a portable electronic device, etc., but the invention is not limited thereto. The portable electronic device may be a laptop, a hand-held cellular phone, a smartphone, a tablet PC, a personal digital assistant (PDA), a digital camera, a digital video camera, a portable multimedia player, a personal navigation device, a handheld game console, or an e-book, but the invention is not limited thereto.

The electronic system 100 includes a host 120 and a data storage device 140. The data storage device 140 includes a flash memory 180 and a controller 160. The controller 160 includes a computation unit 162, a read buffer 165, a dynamic random-access memory (DRAM) 166 and an error-correction circuit 168. The computation unit 162 can be implemented in various manners, such as dedicated hardware circuits or general-purpose hardware (for example, a single processor, a multi-processor capable of performing parallel processing, or other processor with computation capability). For example, the computation unit 162 may be implemented by a general-purpose processor or a microcontroller, but the invention is not limited thereto. The computation unit 162 in the controller 160 may control the flash memory 180 according to the command from the host 120, such as writing data to a designated address of the flash memory 180 or reading page data from a designated address from the flash memory 180.

In the electronic system 100, several electrical signals for coordinating commands and data transfer between the computation unit 162 and the flash memory 180, including data lines, a clock signal and control lines. The data lines are employed to transfer commands, addresses and data to be written and read. The control lines are utilized to issue control signals, such as CE (Chip Enable), ALE (Address Latch Enable), CLE (Command Latch Enable), WE (Write Enable), etc. The access interface 170 may communicate with the flash memory 180 using a SDR (Single Data Rate) protocol or a DDR (Double Data Rate) protocol, such as ONFI (open NAND flash interface), DDR toggle, or others. The computation unit 162 may communicate with the host 120 through an access interface 150 using a designated communication protocol, such as USB (Universal Serial Bus), ATA (Advanced Technology Attachment), SATA (Serial ATA), PCI-E (Peripheral Component Interconnect Express), NVME (Non-volatile Memory Express), or others.

Firmware composed of program code and data is executed by the computation unit 162, and the controller 160 may control the flash memory 180 based on the firmware. The DRAM 166 may be unnecessary. However, the DRAM 166 can be used to temporarily to store program code and parameters, so that the performance of the system can be improved.

The flash memory 180, for example, may be a NAND flash memory including a plurality of physical blocks, and each physical block includes a plurality of pages for storing data. The flash memory 180 further includes a plurality of word lines and a plurality of bit lines, wherein each of the word lines is configured to control at least one page to select the page to be read. For example, when the flash memory 180 is composed of single-level cells (SLC), a bit line is configured to control one page. When the flash memory 180 is composed of multiple-level cells (MLC), a bit line is configured to control two pages. When the flash memory 180 is composed of triple-level cells (TLC), a bit line is configured to control three pages, but the invention is not limited thereto.

In another embodiment, the function of flash translation layer (FTL) 181 can be implemented by the data storage device 140. For example, the logical-to-physical mapping tables (e.g., can be regarded as H2F tables or H2P tables) corresponding to the FTL 181, for example, can be stored in the flash memory 180 of the data storage device 140, and the computation unit 162 may read all or a portion of logical-to-physical mapping tables stored in the flash memory 180 to the DRAM 166.

When the controller 160 reads page data from the flash memory 180 using a read threshold voltage, the retrieved page data is transmitted to the error-correction circuit 168, and the error-correction circuit 168 is configured to perform error correction on the page data, and the error-correction scheme performed by the error-correction circuit 168 can be referred to as hard data decoding. In some embodiments, the error-correction circuit 168 includes a low-density parity-check code (LDPC) error-correction engine (not shown in FIG. 1) and/or a BCH-code error-correction engine (not shown in FIG. 1), but the invention is not limited thereto.

For example, the page data stored in each page of the flash memory 180 includes an error correction code (ECC), such as the LDPC ECC and/or BCH ECC. The error-correction circuit 168 may perform error correction on the read page data according to the ECC in the read page data. Generally, the error-correction circuit 168 has a predetermined ECC capability, such as being capable of correcting N-bit data. If the number of error bits is smaller than or equal to N in the read page data, the error-correction circuit 168 may use the ECC in the read page data to perform error correction on the read page data, and output the corrected page data to the host 120.

If the number of error bits in the read page data is greater than N, the error-correction circuit 168 is not capable of performing error correction on the read page data using the ECC in the read page data. Meanwhile, the error-correction circuit 168 may inform the controller 160 of failure of error correction, and the controller 160 may activate the error-handling procedure, such as performing a read-retry procedure to obtain correctable page data from the flash memory 180.

The read-retry procedure may perform read operations according to a read-retry table 141. The read-retry table 141 includes a plurality of entries, and each entry records a configuration of a read threshold voltage required for the read operation. In an embodiment, the read-retry table 141 can be integrated in the FTL 181 of the data storage device 140. In another embodiment, the read-retry table 141, for example, can be stored in the flash memory 180. When the read-retry procedure is being executed, the read-retry procedure may retrieve the read-retry table 141 from the flash memory 180. In yet another embodiment, the read-retry table 141 can be referred to as a lookup table in the controller 160, and can be implemented by hardware circuits, such as a complex programmable logic device (CPLD), a programmable array logic (PAL), a programmable logic array (PLA), etc., but the invention is not limited thereto.

The address (e.g., number) of each entry in the read-retry table 141 may indicate the priority order of the read operation performed by the controller 160. For example, if the read-retry table 141 includes N entries, and each entry respectively corresponds to address #0~#(N−1). The read threshold voltage Vth in the entry at address #0 may have the highest rank or priority, and the read threshold voltage Vth in the entry at address #(N−1) may have the lowest rank or priority. Alternatively, the priorities for entries #0~#(N−1) can be reversely ordered, such as the read threshold voltage Vth in the entry at address #(N−1) having the highest rank or priority, and the read threshold voltage Vth in the entry at address #0 having the lowest rank or priority.

In some embodiments, the addresses of the entries in the read-retry table 141 can be divided into a plurality of ranges (or regarded as sub-read-retry tables), wherein each range may include one or more entries, and the entries in each range may correspond to one or more application scenarios, such as a high-temperature scenario (e.g., operating at or above 50 degree C. for a month) and/or read disturbance (e.g., the same flash memory cell has been read for over 500 thousand times), but the invention is not limited thereto. For example, when the data storage device 140 is in a specific application scenario and the controller 160 determine that the read-retry table 141 is required to perform read operations, the controller 160 may read the entries in the specific range corresponding to the specific application scenario from the read-retry table 141 to sequentially perform read-retry operations.

In an embodiment, when the controller 160 determines to perform the read-retry procedure, the controller 160 may first perform the read operation using the configuration of the read threshold voltage Vth in entry #0. When the page data in the flash memory 180 cannot be successfully read using the read threshold voltage Vth in entry #0 (i.e., error in the page data cannot be corrected by the error-correction circuit 168, and it indicates a failure of error correction by the hardware circuit), the controller may then use the read threshold voltage Vth in entry #1 (i.e., the next entry) to perform the read operation on the flash memory 180, and so forth. The aforementioned procedure can be regarded as a trial-and-error loop.

For example, if a configuration of the read threshold voltage Vth in a specific entry can be used by the controller 160 to successfully read the page data from the flash memory 180 in the read-retry procedure of sequentially using each of the entries in the read-retry table, the read-retry procedure ends, and the controller 160 may report the corrected page data to the host 120 via the access interface 170. If the controller 160 has tried all the read threshold voltage Vth in the N entries in the read-retry table 141 and fails to successfully read the page data from the flash memory 180, the controller 160 may utilize the computation unit 162 to perform soft-decoding error correction.

For example, each time the controller 160 reads page data from the flash memory 180 using the configuration of the read threshold voltage corresponding to each entry in the read-retry table and the error-correction circuit 168 fails to perform error correction on the read page data using hard error decoding, the original read page data (or the calibrated page data) may be recorded in a register or DRAM 166 by the computation unit 162. If the controller 160 has tried all configuration of the read threshold voltage Vth in the N entries in the read-retry table 141 and fails to successfully read the page data from the flash memory 180, the controller 160 may perform soft-decoding error correction on the stored page data that are previously stored each time hard error decoding fails. Meanwhile, the computation unit 162 may need to perform time-consuming soft decoding error correction calculation with high complexity, thereby correcting the page data with the higher number of error bits to the correct page data, and report the corrected correct page data to the host 120.

In an embodiment, the computation unit 162 may directly perform soft decoding on multiple pieces of page data stored in the read buffer 165, and then perform calculation of error correction. In another embodiment, the computation unit 162 may directly perform soft decoding on multiple pieces of page data stored in the read buffer 165 to generate to-be-corrected page data, wherein the to-be-corrected page data is calculated by the computation 162 according to the correlation between the multiple pieces of page data stored in the read buffer 165 (e.g., may be original page data or corrected page data after hard decoding, i.e., still has error bits), and the number of error bits in the to-be-calibrated page data is less than the error-correction capability of the error-correction circuit 168. Accordingly, the computation unit 162 may input the to-be-corrected page data to the error-correction circuit 168 for error correction to obtain corrected correct page data.

Figure 2:
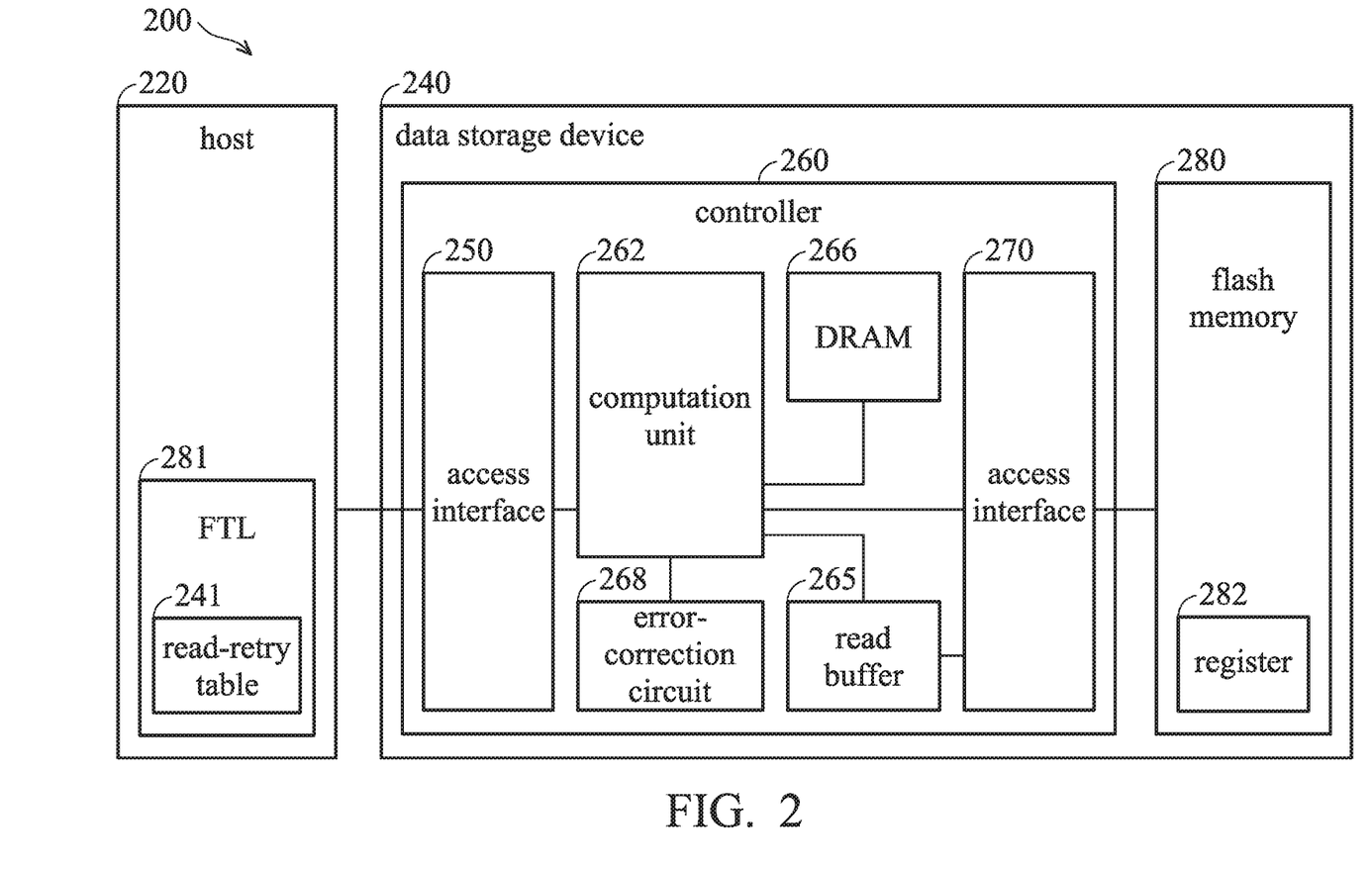
FIG. 2 is a block diagram of the electronic system in accordance with another embodiment of the invention.

FIG. 2 is a block diagram of the electronic system in accordance with another embodiment of the invention. The electronic system 100 in FIG. 1, for example, may be implemented by the electronic system 200 in FIG. 2, and the components in the electronic system 200 correspond to those in the electronic system 100, and thus the details will be omitted here.

However, it should be noted that the difference between the electronic systems in FIG. 1 and FIG. 2 is that the FTL 281 in FIG. 2 is disposed in the host 220 rather than the computation unit 162. For example, the host 220 may designate a corresponding physical address in the flash memory 280 of the data storage device 240 in the access command, and transmit the access command to the computation 162 via the access interface 250. The computation unit 162 may perform corresponding operations according to the designated physical address in the access command. In other words, the computation unit 162 need not perform the operation converting the logical address into the physical address.

In an embodiment, the read-retry table 241 in the electronic system 200, for example, can be integrated into the FTL 281 of the host 220. In another embodiment, the read-retry table 241 may be a lookup table in the controller 260, and can be implemented by hardware circuits such as such as a complex programmable logic device (CPLD), a programmable array logic (PAL), a programmable logic array (PLA), etc., but the invention is not limited thereto.

It should be noted that when the read-retry table 241 is integrated in the FTL 281 of the host 220, the host 220 may read the read-retry table 241 in the FTL 281 upon the electronic system 200 is booted up, and generate micro-codes for the read-retry operations. For example, the read threshold voltage Vth in each entry of the read-retry table 241 is converted into a corresponding micro-code. Afterwards, the host 220 may store the micro-codes in an instruction buffer (not shown in FIG. 2) of the controller 260. The controller 260 may perform the corresponding read operations according to the micro-codes stored in the instruction buffer. In some embodiments, when the host 220 determines that the order of each entry in the read-retry table 241 should be updated, the host 220 may again convert the read threshold voltage in each entry of the read-retry table 241 into a corresponding micro-code, and store the updated micro-code in the instruction buffer in the controller 260.

Figure 3:
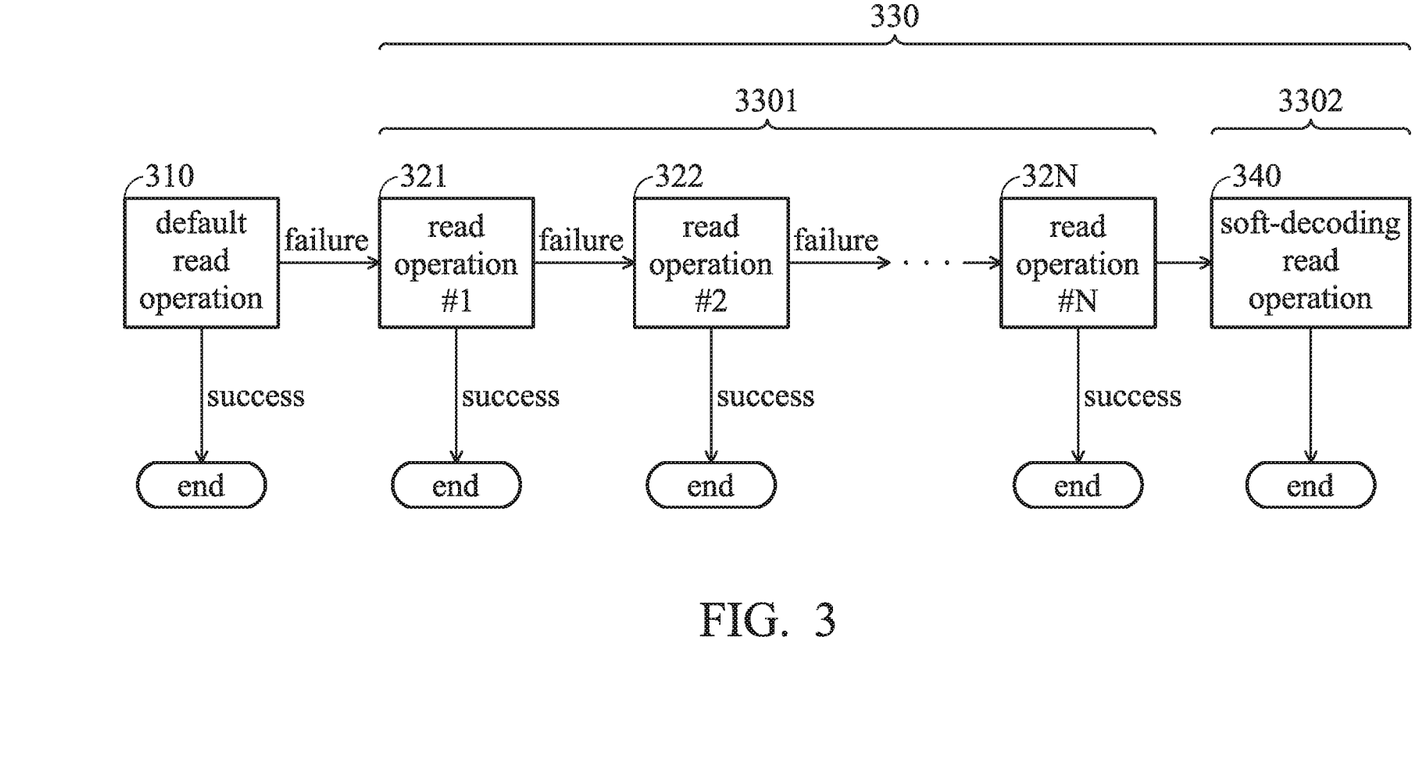
FIG. 3 is a diagram of the procedure for reading page data in accordance with an embodiment of the invention.

FIG. 3 is a diagram of the procedure for reading page data in accordance with an embodiment of the invention. Referring FIG. 1 and FIG. 3, each time when the host 120 issues a read command to the controller 160, in block 310, the controller 160 may perform the default read operation. For example, the controller 160 may read page data from the flash memory 180 using the configuration of a default read threshold voltage. When the controller 160 determines that the configuration of the default read threshold voltage is used and fails to correct the page data read from the flash memory 180 by the error-correction circuit 168, the controller 160 may perform the read-retry procedure. For example, the read operation in each block within range 330 belongs to the trial-and-error loop of the read-retry procedure. In an embodiment, the controller 160 may change the configuration of the read threshold voltage by setting a register 182 in the flash memory 180. In another embodiment, the register 182 can be disposed in the controller 160.

For example, the trial-and-error loop within range 330 includes the hard-decoding error correction within range 3301 and the soft-decoding error correction within range 3302. The error-correction circuit 168 may perform hard-decoding error correction in blocks 331-33N within range 3301, and each of blocks 331-33N corresponds read operation #1 to read operation #N, and corresponds to the first entry to the N-th entry (e.g., address #0 to #N−1) in the read-retry table 141. In block 340 within range 3302, the computation unit 162 may perform the soft-decoding error correction.

Each time the read operation executed in a specific block within range 3301 fails (i.e., the page data read from the flash memory 180 using the configuration of the read threshold voltage in the corresponding entry in the read-retry table 141 cannot be corrected by the error-correction circuit 168), the controller 160 may perform the read operation in the next block to read page data from the flash memory 180 using the configuration of the read threshold voltage in the next entry in the read-retry table 141, and the error-correction circuit 168 may perform error correction on the read page data. If the error-correction circuit 168 successfully performs error correction on the read page data in the specific block, the controller 160 may exit the trial-and-error loop, and report the corrected correct page data to the host 120.

It should be noted that the default read operation in block 310 does not belong to the trial-and-error loop. For example, the flash memory 180 has a configuration of the default read threshold voltage for performing the default read operation. When the default read operation fails, the read-retry procedure may then be executed, and the read operations #1~#N using configurations of different read threshold voltages are sequentially performed. In addition, the host 220 in FIG. 2, for example, may activate the read-retry procedure, or command the controller 260 to activate the read-retry procedure. Then, the host 220 may command the controller 260 to modify the value stored in register 282 in the flash memory 280, or the controller 260 may modify the value stored in register 282 in the flash memory, thereby changing the default read threshold voltage.

The configuration of the default read threshold voltage of the flash memory 180 may be not appropriate for some scenarios, such as the flash memory 180 being operated over a predetermined temperature above 50 degree C. for a predetermined period of time, or the flash memory cells in the flash memory 180 having been read or erased more than a predetermined number of times, but the invention is not limited thereto. In the aforementioned scenarios, the controller 160 in FIG. 1 may modify the value stored in register 182 of the flash memory 180 to change the configuration of the default read threshold voltage. In addition, the host 220 in FIG. 2 may command the controller 260 to modify the value stored in register 282 of the flash memory 280 to change the configuration of the default read threshold voltage. Accordingly, when the controller 160 or 260 performs the default read operation in block 310, a higher success rate can be achieved, resulting in a lower chance to activate the read-retry procedure, thereby reducing the number of read operations and improving the efficiency for reading data.

Figure 4A:
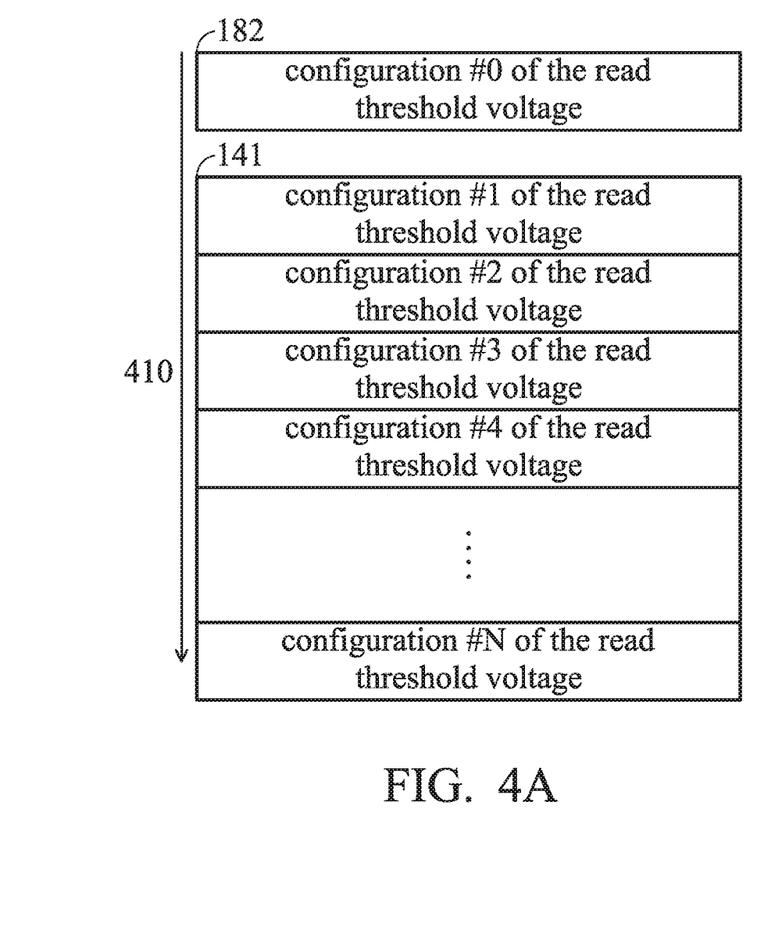
FIG. 4A is a diagram of a read-retry table in accordance with an embodiment of the invention.
Figure 4B:
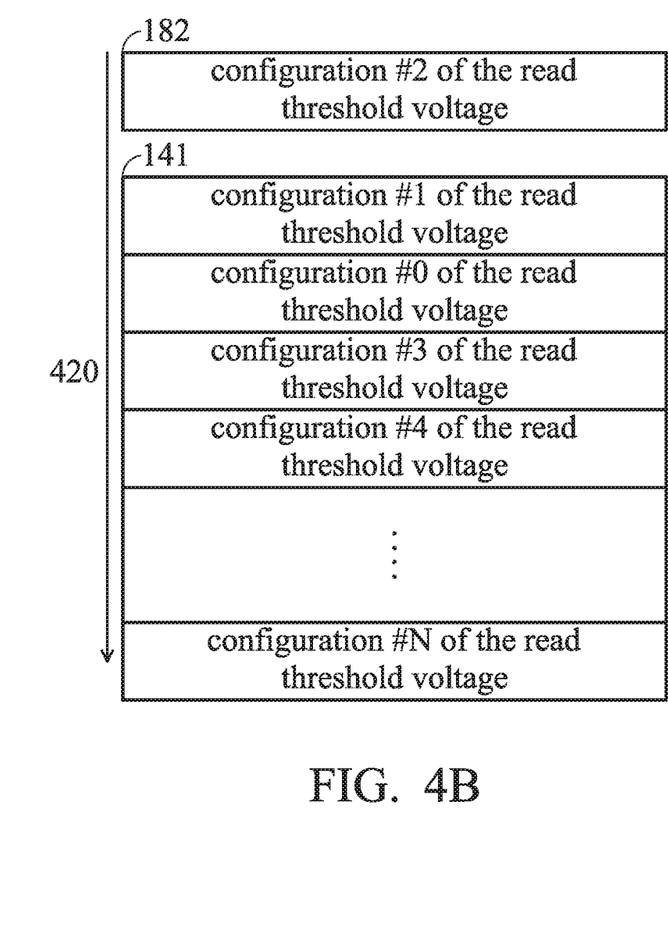
FIG. 4B is a diagram of the updated read-retry table in accordance with the embodiment of FIG. 4A.

FIG. 4A is a diagram of a read-retry table in accordance with an embodiment of the invention. FIG. 4B is a diagram of the updated read-retry table in accordance with the embodiment of FIG. 4A.

Referring FIG. 1, FIG. 3, and FIGS. 4A-4B, in an embodiment, the controller 160 may perform the procedure for reading page data in FIG. 3 in a predetermined order (e.g., arrow 410 in FIG. 4A). For example, the default read threshold voltage (e.g., can be referred to as configuration #0 of the read threshold voltage) is used to read the page data from the flash memory 180 (i.e., the default read operation in block 310). In response to the failure of the default read operation in block 310, the read-retry procedure is activated. Meanwhile, the controller 160 may perform the trial-and-error loop in ascending order based on the ranking of the configuration in each entry of the read-retry table 141. For example, the entries 1 to N in the read-retry table 141 may correspond to the configurations #1 to #N of the read threshold voltages, as shown in FIG. 4A. It should be noted that the ranking of the configuration in each entry in the read-retry table 141 in FIG. 4A is in the initial condition, and can be regarded as an initial ranking.

After the data storage device 140 has operated for a period of time, the environmental conditions (e.g., temperature) of the data storage device 140 may change or the erase count or read count of the flash memory cells in the flash memory 180 may increase, and thus the page data cannot be successfully read from the flash memory 180 using the default read threshold voltage in this situation. Accordingly, the controller 160 may perform an adaptive sorting method to adjust the order of the entries of the read-retry table 141, wherein the details of the adaptive sorting method will be described later.

For example, as depicted in FIG. 4B, after the controller 160 has perform the adaptive sorting method, original configuration #2 of the read threshold voltage in the second entry of the read-retry table 2 is set to the default read threshold voltage, and configuration #0 of the read threshold voltage is updated to the second entry of the read-retry table 141. Accordingly, after the updating, the controller 160 may start to perform the default read operation using the updated default read threshold voltage according to the updated order in arrow 420 in FIG. 4B. If the read-retry procedure is activated, the controller 160 may sequentially perform the read operation using the configuration of the read threshold voltage recorded in the first entry to the N-th entry of the updated read-retry table 141.

It should be noted that the ranking of the configuration of the read threshold voltage in each entry of the read-retry table 141 can be adjusted when the controller 160 determines that it is necessary. For example, the controller 160 may determine whether to update the ranking of the configurations of read threshold voltages for a predetermined period of time. Additionally, the controller 160 may immediately update the ranking of the configurations of read threshold voltages in response to the data storage device 140 being in the specific scenario in the aforementioned embodiment.

In an embodiment, the adaptive sorting method in the present invention can be performed according to the statistical data of successful read-retry operations and unsuccessful read-retry operations from the flash memory 180 performed by the controller 160, such as the success count and failure count of read-retry operations.

Specifically, the controller 160, for example, may first use the initial ranking (e.g., in a first order) shown in FIG. 4A to perform the default read operation and the subsequent read operations, and calculate the success count for read operations of the respective read threshold voltage of the read-retry table 141 that successfully exits the trial-and-error loop in a period (T) from a start time (e.g., time point t) to an end time (e.g., time point t+T). Then, at time point t+T, the controller 160 may sort the success count of the respective configuration of each read threshold voltage within the period T from time point t to time point t+T in descending order to obtain the second order. The controller 160 may replace the first order by the second order, and reset the counter of the respective configuration of each read threshold voltage. Afterwards, the controller 160 may sort the success count of the respective configuration of each read threshold voltage within the period T from time point t+T to time point t+2T in descending order to obtain a third order, and replace the second order by the third order, and so forth.

In an embodiment, if the environment or operation condition of the data storage device 140 does not change much, the first order may be equal to the second order, and the third order may be equal to the second order. However, if the environment or operating condition of the data storage device 140 changes greatly, the frequency for updating the order of the respective configuration of each read threshold voltage may increase, such as updating the order of the respective configuration of each read threshold voltage every cycle T. If the read-retry table in the aforementioned is a portion of the read-retry table 141, such as a sub-read-retry table, after a predetermined number of cycles T, the controller 160 may select another appropriate sub-read-retry table from the read-retry table 141 to replace the original sub-read-retry table.

In another embodiment, when the average erase count of the flash memory cells in the flash memory 180, for example, has increased to a predetermined erase count (e.g., 1000 times), the controller 160 may also select another appropriate sub-read-retry table from the read-retry table 141 to replace the original sub-read-retry table. In addition, in the aforementioned embodiment, after the controller 160 has replaced the original sub-read-retry table with the new sub-read-retry table, the controller 160 may continue to utilize the adaptive sorting method described above to calculate the success count of the respective configuration of each read threshold voltage stored in register 182 and each entry in the new sub-read-retry table within one cycle T, thereby updating the order of the respective configuration of each read threshold voltage stored in register 182 and each entry in the new sub-read-retry table.

It should be noted that the present invention is not limited to the adaptive sorting method described in the aforementioned embodiments to adjust the order of the respective configuration of each read threshold voltage stored in register 182 and each entry in the read-retry table 141.

Figure 5:
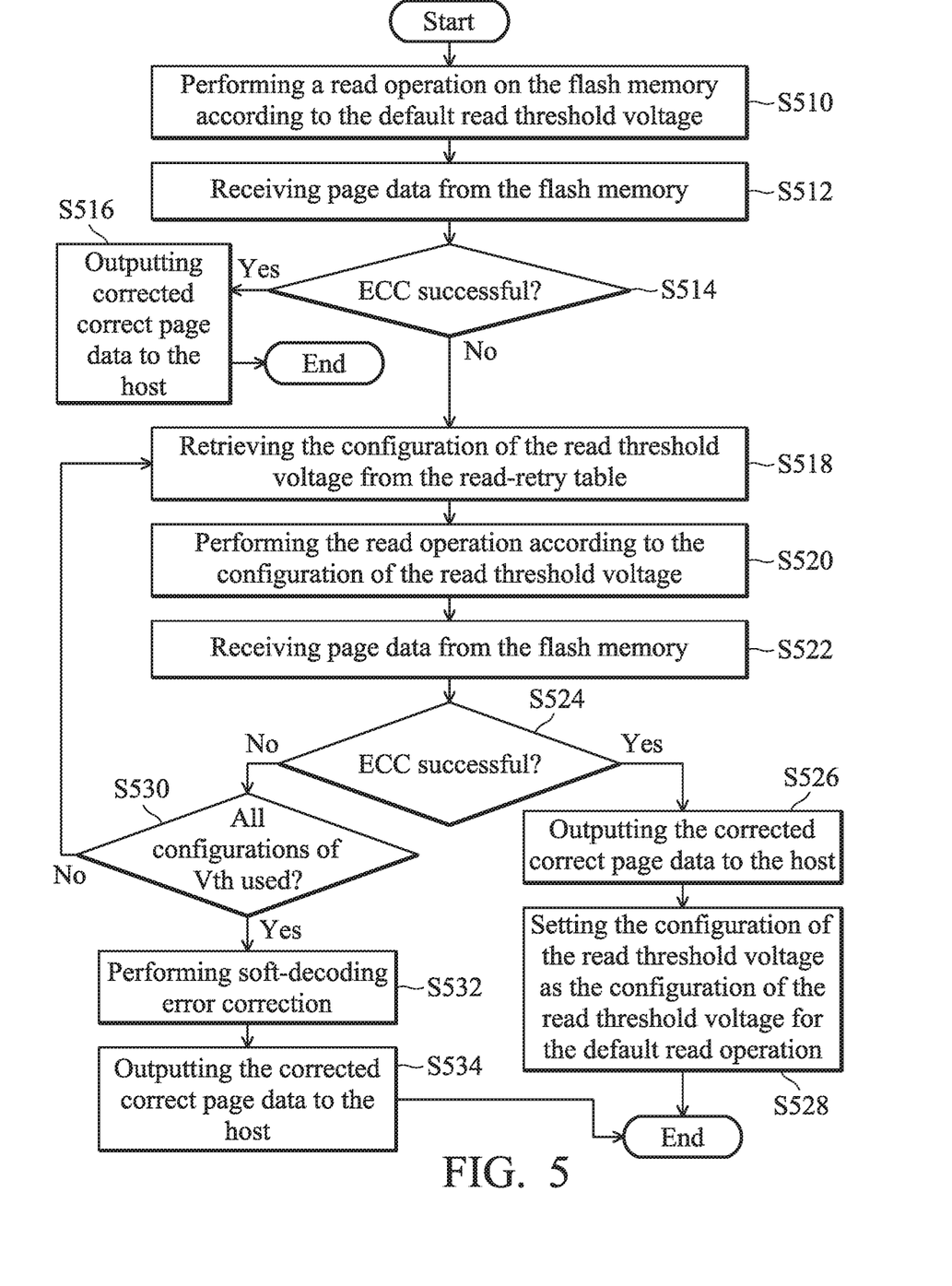
FIG. 5 is a flow chart of an adaptive data-reading method in accordance with an embodiment of the invention.

FIG. 5 is a flow chart of an adaptive data-reading method in accordance with an embodiment of the invention.

Referring to FIG. 1 and FIG. 5, in step S510, the controller 160 performs a read operation on the flash memory 180 according the default read threshold voltage. For example, the controller 160 may receive a host read command from the host 120, and convert the host read command to a read-operation instruction of the flash memory 180. While executing the read-operation instruction, the controller 160 may perform the read operation on the flash memory 180 using the read threshold voltage corresponding to configuration #0 of the read threshold voltage.

In step S512, the controller receives page data from the flash memory 180. For example, the page data may be uncorrected original page data, and the controller may temporarily store the page data into the read buffer 165 or output the page data to the error-correction circuit 168.

In step S514, the error-correction circuit 168 of the controller 160 determines whether the page data can be successfully corrected. If the page can be successfully corrected, the error-correction circuit 1568 performs error correction on the page data to generate corrected correct page data. Then, the controller 160 may output the correct page data to the host 120 (step S516), and the flow ends. If the page cannot be successfully corrected, the controller 160 may activate the read-retry procedure, and step S518 is performed.

In step S518, the configuration of the read threshold voltage is obtained from the read-retry table 141. For example, each time step S518 is performed, the controller 160 may select the configuration of the read threshold voltage from the next entry in the read-retry table 141, such as reading configuration #2 of the read threshold voltage. Each read threshold voltage has a respective configuration, and the controller 160 may control or generate the read threshold voltage required by the flash memory 180 according to the configuration of the read threshold voltage.

In step S520, the controller 160 performs the read operation according to the configuration of the read threshold voltage. For example, while performing the read-operation instruction, the controller 160 may perform the read operation on the flash memory 180 using the read threshold voltage corresponding to configuration #2 of the read threshold voltage to obtain the page data stored in a specific physical address in the flash memory 180, wherein the specific physical address is designated by the read-operation instruction.

In step S522, the controller receives the page data from the flash memory 180. The page data may be uncorrected original page data, and is stored in the read buffer 165 of the controller 160.

In step S524, the error-correction circuit 168 determines whether the page data can be successfully corrected. If the page data can be successfully corrected, the controller 160 may output the corrected correct page data to the host 120 (step S526). If the page cannot be successfully corrected, step S530 is performed.

In step S528, the controller 160 may set the configuration of the read threshold voltage (i.e., ECC successfully performed) as the configuration of the read threshold voltage for the default read operation. For example, the controller 160 may set configuration #2 of the read threshold voltage, that is retrieved from the read-retry table 141, to the configuration of the read threshold voltage for the default read operation. That is, when the controller 160 is to read another page data from the flash memory 180, the controller 160 may use configuration #2 of the read threshold voltage as the configuration of the read threshold voltage for the default read operation rather than use configuration #0 of the read threshold voltage. For example, the controller 160 may replace configuration #0 of the read threshold voltage by configuration #2 of the read threshold voltage. Alternatively, the controller 160 may swap the entries of configurations #2 and #0 of the read threshold voltages. Alternatively, the controller 160 may directly replace configuration #0 of the read threshold voltage by configuration #2 of the read threshold voltage, and delete the entry recording configuration #2 of the threshold voltage, where the entries after the entry recording configuration #2 can be successively replenished.

In step S530, the controller 160 determines whether each configuration of the read threshold voltage in each entry of the read-retry table 141 has been used. If each configuration of the read threshold voltage in each entry of the read-retry table 141 has been used, it indicates that the error-correction circuit 168 is incapable of successfully correcting the page data from the flash memory 180 by hard-decoding error correction, and step S532 is performed, and the computation unit 162 may perform soft-decoding error correction to the page data to generate corrected correct page data.

In step S534, the corrected correct page data is output to the host 120. For example, once the computation unit 162 is to be used to perform the soft-decoding error correction, it indicates that the computation unit 162 may perform soft-decoding error correction on multiple pieces of original page data (or corrected page data after hard-decoding error correction, i.e., still has error bits) previously read using the respective configuration of each read threshold voltage in each entry of the read-retry table 141. Although the error-correction capability of the soft-decoding method is higher than that of the hard-decoding method, it may also consume a considerable amount of computing resources and computing time (i.e., including the time taken for hard-decoding error correction) of the computation unit 162 to calculate the correct page data. Although the correct page data can be obtained using the soft-decoding error correction, this may also cause the data storage device 140 to have a long read delay and low read performance.

It should be noted that that the flow in FIG. 5 can also be performed by the electronic system 200 in FIG. 2. If the electronic system 200 in FIG. 2 is used to perform step S510, the operations of the electronic system 200 may be different from those of the electronic system 100 in FIG. 1. For example, because the host 220 in the electronic system 200 includes the FTL 281 and the read-retry table 241, the host 220 may pre-store the respective configuration of the read threshold voltage in each entry of all or a required portion range of the read-retry table 241 in the DRAM 266 of the controller 260, and the host 220 may send a host read command including a physical address to the controller 260, and receive the page data or corrected correct page data reported from the controller 260.

In view of the above, in the flow of FIG. 5, as long as the controller 160 activates the read-retry procedure, one or more read operations will be performed. The controller 160 may replace the configuration of the read threshold voltage for the default read operation by the configuration of the read threshold voltage that is capable of successfully read the page data in the trial-and-error loop. That is, the controller 160 may update the configuration of the read threshold voltage for the default read operation, so that the controller 160 may be effectively prevent from activating the read-retry procedure.

Figure 6A:
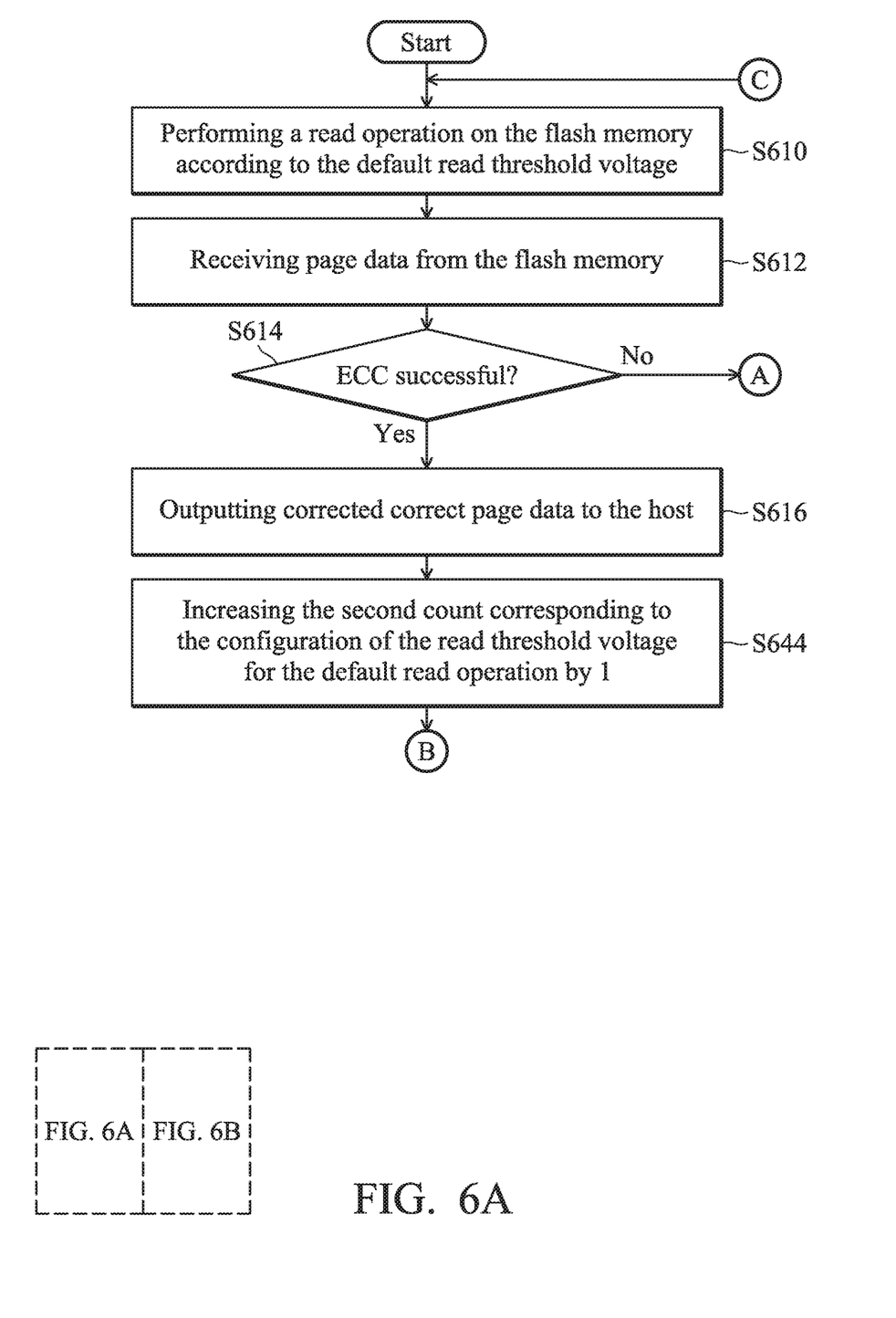
FIGS. 6A-6B are portions of a diagram of an adaptive data-reading method in accordance with another embodiment of the invention.
Figure 6B:
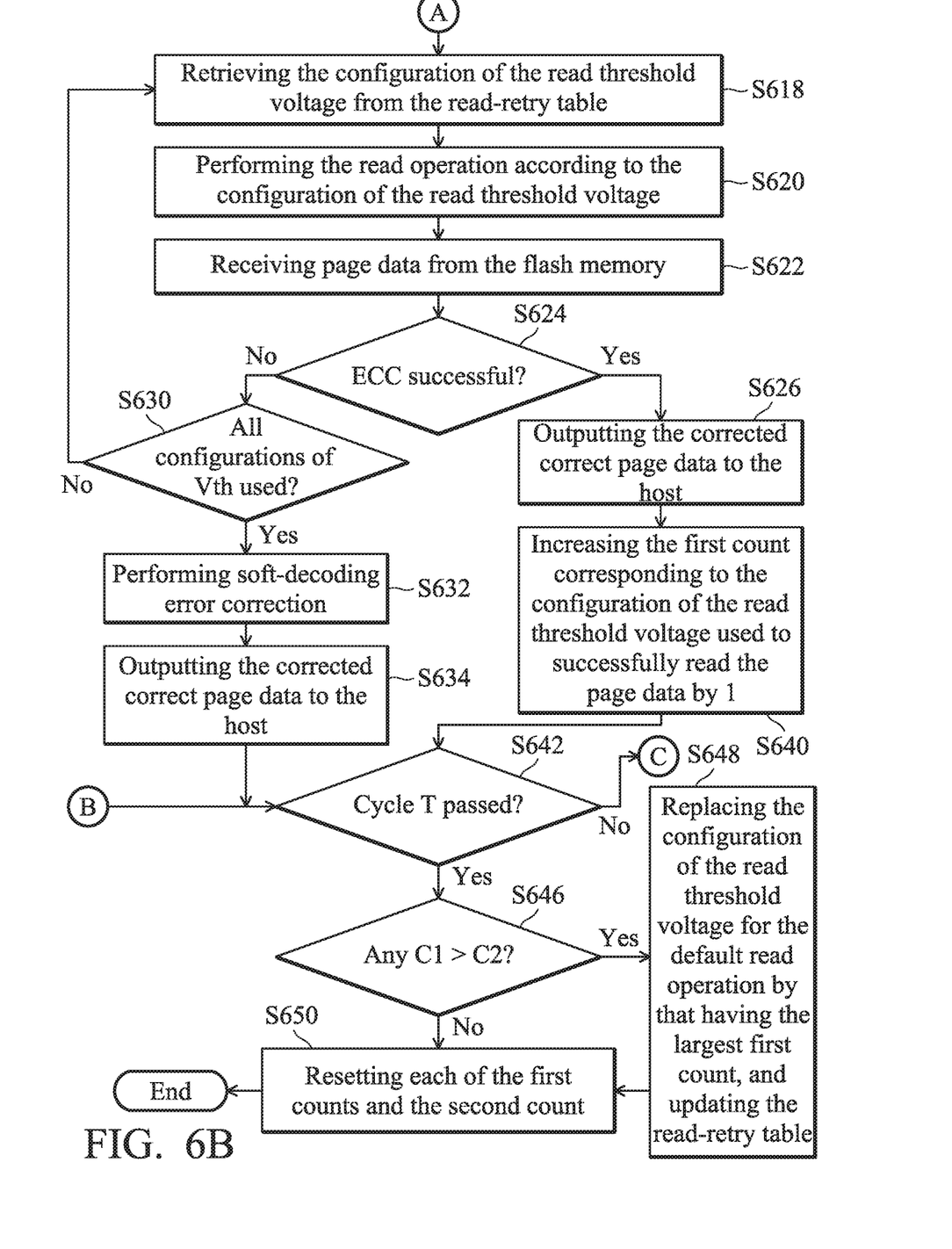

FIGS. 6A-6B are portions of a diagram of an adaptive data-reading method in accordance with another embodiment of the invention.

The flow in FIGS. 6A-6B is similar to that in FIG. 5. For example, steps S610~S634 in FIGS. 6A-6B correspond to steps S510~S534 in FIG. 5, and thus the details for steps S610~S634 will be omitted here. The primary difference between the flows in FIGS. 6A-6B and FIG. 5 is that the mechanism for replacing the configuration of the read threshold voltage for the default read operation in FIG. 6 is different from that in FIG. 5.

For example, after activating the read-retry procedure, in step S640, a first count C1 corresponding to the configuration of the read threshold voltage that is used to successfully read the page data is increased by 1.

In step S642, the controller 160 determines whether a cycle T has passed. If the cycle T has passed, step S646 is performed. If the cycle T has not passed yet, step S610 is performed to receive the next read command. In some embodiments, the controller 160 may determine whether a predetermined read count N has been reached. In step S642, no matter whether the cycle T or the predetermined read count N is used for determination, the values of the cycle T or the predetermined read count N can be adjusted according to the operating condition of the flash memory 180. For example, when the flash memory 180 is initially used, a larger value can be used for the cycle T and the predetermined read count N. When the life of the flash memory 180 is about to end, a smaller value can be used for the cycle T and the predetermined read count N, but the invention is not limited thereto.

In step S644, a second count C2 corresponding to the configuration of the read threshold voltage for the default read operation is increased by 1. Since step S616 is followed by step S644 and the controller 160 may successfully read the page data from the flash memory 180 using the configuration of the read threshold voltage for the default read operation, the controller 160 may increase the second count C2 corresponding to the default read threshold voltage by 1.

In step S646, it is determined whether any first count C1 is greater than the second count C2. If any first count C1 is greater than the second count C2, step S648 is performed. If no first count C1 is greater than the second count C2, step S650 is performed. For example, if any first count C1 is greater than the second count C2, it indicates that, in the cycle T, the success count of the configuration of the read threshold voltage of a specific entry in the read-retry table 141 is greater than that for the default read operation, and thus the configuration of the read threshold voltage of the specific entry may replace that for the default read operation. Accordingly, in the next cycle T, the controller 160 may first use the updated configuration of the read threshold voltage for the default read operation to read the page data from the flash memory 180 with a higher success rate. That is, the chance for the controller 160 to enter the trial-and-error loop in the read-retry procedure can be reduced, so that the read delay of the data storage device 140 can be reduced and the read performance of the data storage device 140 can be improved.

In an embodiment, the first counts and the second count may increase according to other statistical data, such as the success rate corresponding to the configuration of each read threshold voltage. Alternatively, a sample counter is used to increase the corresponding first count or second count by 1 every time for a predetermined number of times, thereby reducing the computational burden on the electronic system 100.

In step S648, the configuration of the read threshold voltage for the default read operation is replaced by that having the largest first count, and the read-retry table 141 is updated. For example, the controller 160 may sort all the first counts and the second count in descending order. Since step S648 is performed in the condition that any of the first counts is greater than the second count, the configuration of the read threshold voltage having the largest first count is deemed to be the largest value among all the first counts and the second count. Thus, the configuration of the read threshold voltage having the largest first count can be used as the configuration of the read threshold voltage for the default read operation in the next cycle T. The remaining first counts and the second count are sorted in descending order, and the configurations of the read threshold voltages corresponding to the sorted first counts and second count are successively updated into a respective entry in the read-retry table 141.

In step S650, each of the first counts and the second count are reset. For example, for every cycle T, the controller 160 may determine which configuration of the read threshold voltage has the largest success count according to the statistical data of each of the first counts and the second count in the current cycle.

In the flow of FIGS. 6A-6B, when a cycle T has passed or a predetermined read count N has been reached, the controller 160 may sort the count values of the configurations of the read threshold voltages (e.g., including the configuration of the read threshold voltage for the default read operation, and the configurations of N read threshold voltages in the read-retry table 141) being capable of successfully read the page data in descending order (e.g., N+1 count values including N first counts and the second count), wherein the configuration of the read threshold voltage having the greatest count value will be set as the configuration of the read threshold voltage for the default read operation in the next cycle T. The configurations of the read threshold voltages having the second greatest count value to the smallest count value will be successively updated into the first entry to the N-th entry in the read-retry table 141. The flow in FIG. 5 can be regarded as a special case in the flow of FIGS. 6A-6B, such as a fixed cycle T or a very small value of the predetermined read count N. Thus, every time when the controller 160 successfully read the page data from the flash memory 180 with the configuration of a read threshold voltage in the read-retry table 141, the controller 160 may update the configuration of the read threshold voltage for the default read operation with the current configuration of the read threshold voltage capable of successfully reading the page data from the flash memory 180.

In view of the above, a data storage and an adaptive data-reading method thereof are provided in the present invention. The data storage and the adaptive data-reading method are capable of updating the ranking of the default read threshold voltage and the read threshold voltage corresponding to each entry in the read-retry table in a check point, replace the default read threshold voltage with the read threshold voltage having the highest rank, so that the data storage device may replace the original default read threshold voltage with an more appropriate default read threshold voltage in some scenarios. Thus, the chance to enter the trial-and-error loop can be reduced in response to failure of the default read operation using the default read threshold voltage, thereby reducing the read delay of the data storage device and improving the read performance of the data storage device.

While the invention has been described by way of example and in terms of the preferred embodiments, it should be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A data storage device, comprising:
a flash memory, comprising a plurality of blocks for storing data, each of the blocks comprising a plurality of pages; and
a controller, configured to receive a host read command from a host, and convert the host read command into a read-operation instruction to the flash memory to perform a default read operation to read page data from one of the pages of the flash memory, wherein the default read operation has a configuration of a default read threshold voltage,
wherein in response to a failure of the default read operation, the controller is configured to sequentially perform a read operation on the flash memory using a configuration of a respective read threshold voltage corresponding to each entry of a plurality of entries in a read-retry table, and replace the configuration of the default read threshold voltage with the configuration of the read threshold voltage corresponding to the read operation being successfully performed,
wherein in response to the data storage device being in a specific scenario, the controller replaces the read-retry table with another read-retry table corresponding to the specific scenario.

2. The data storage device as claimed in claim 1, wherein the controller comprises an error-correction circuit configured to perform error correction on the page data read by the default read operation or the read operation,
wherein in response to the error-correction circuit determining being capable of performing error correction on the page data read by the default read operation or the read operation to generate correct page data, the controller determines that the default read operation or the read operation was successfully performed,
wherein in response to the error-correction circuit determining not being capable of performing error correction on the page data read by the default read operation or the read operation to generate correct page data, the controller determines that the default read operation or the read operation has failed.

3. The data storage device as claimed in claim 1, wherein the configuration of the default read threshold voltage and the configuration of the read threshold voltage of each entry in the read-retry table has an initial rank, and the configuration of the default read threshold voltage has the highest initial rank,
wherein the controller calculates an updated ranking of the configuration of the default read threshold voltage and the configuration of the read threshold voltage of each entry in the read-retry table in a check point, replaces the configuration of the default read threshold voltage with the configuration of the read threshold voltage or the configuration of the default read threshold voltage having the highest rank in the updated ranking, and sequentially updates each of other configurations of the read threshold voltages to each entry in the read-retry table according to the updated ranking.

4. The data storage device as claimed in claim 3, wherein the check point is every fixed time cycle.

5. The data storage device as claimed in claim 3, wherein the check point is that a read count of flash memory cells in the flash memory has reached a predetermined number of times.

6. The data storage device as claimed in claim 3, wherein the updating ranking is determined by a success count corresponding to each of the configurations of the read threshold voltages in the entries of the read-retry table and the configuration of the default read threshold voltage in the check point.

7. The data storage device as claimed in claim 3, wherein the updating ranking is determined by a success rate corresponding to each of the configurations of the read threshold voltages in the entries of the read-retry table and the configuration of the default read threshold voltage in the check point.

8. The data storage device as claimed in claim 1, wherein the specific scenario indicates that the data storage device has operated at a higher temperature than a predetermined temperature for a predetermined period of time, or that an average erase count of flash memory cells in the flash memory is greater than a predetermined erase count.

9. The data storage device as claimed in claim 2, wherein in response to the read operation corresponding to the configuration of the read threshold voltage in each entry in the read-retry table performed by the error-correction circuit indicating a failure, the controller performs soft-decoding error correction on the page data read by the read operation using the configuration of the read threshold voltage of each entry in the read-retry table to generate corrected correct page data, and reports the corrected correct page data to the host.

10. An adaptive data-reading method, for use in a data storage device, wherein the data storage device comprises a flash memory having a plurality of blocks, and each of the blocks comprises a plurality of pages, the method comprising:
  receiving a host read command from a host;
  converting the host read command into a read-operation instruction to the flash memory to perform a default read operation to read page data from one of the pages of the flash memory, wherein the default read operation has a configuration of a default read threshold voltage;
  in response to a failure of the default read operation, sequentially performing a read operation on the flash memory using a configuration of a read threshold voltage corresponding to each entry of a plurality of entries in a read-retry table, and replacing the configuration of the default read threshold voltage with the configuration of the read threshold voltage corresponding to the read operation being successfully performed; and
  in response to the data storage device being in a specific scenario, replacing the read-retry table with another read-retry table corresponding to the specific scenario.

11. The method as claimed in claim 10, wherein a controller in the data storage device comprises an error-correction circuit configured to perform error correction on the page data read by the default read operation or the read operation, and the method further comprises:
  in response to the error-correction circuit determining being capable of performing error correction on the page data read by the default read operation or the read operation to generate correct page data, determining that the default read operation or the read operation was successfully performed; and
  in response to the error-correction circuit determining not being capable of performing error correction on the page data read by the default read operation or the read operation to generate correct page data, determining that the default read operation or the read operation has failed.

12. The method as claimed in claim 10, wherein the configuration of the default read threshold voltage and the configuration of the read threshold voltage of each entry in the read-retry table has an initial ranking, and the configuration of the default read threshold voltage has the highest initial rank, and the method further comprises:
  calculating an updated ranking of the configuration of the default read threshold voltage and the configuration of the read threshold voltage of each entry in the read-retry table in a check point;
  replacing the configuration of the default read threshold voltage with the configuration of the read threshold voltage or the configuration of the default read threshold voltage having the highest rank in the updated ranking; and
  sequentially updating each of other configurations of the read threshold voltages to each entry in the read-retry table according to the updated ranking.

13. The method as claimed in claim 12, wherein the check point indicates every fixed time cycle.

14. The method as claimed in claim 12, wherein the check point indicates that a read count of flash memory cells in the flash memory has reached a predetermined number of times.

15. The method as claimed in claim 12, further comprising:
  determining the updated ranking by a success count corresponding to each of the configurations of the read threshold voltages in the entries of the read-retry table and the configuration of the default read threshold voltage in the check point.

16. The method as claimed in claim 12, further comprising:
  determining the updating ranking by a success rate corresponding to each of the configurations of the read threshold voltages in the entries of the read-retry table and the configuration of the default read threshold voltage in the check point.

17. The method as claimed in claim 10, wherein the specific scenario indicates that the data storage device has operated at a higher temperature than a predetermined temperature for a predetermined period of time, or that an average erase count of flash memory cells in the flash memory is greater than a predetermined erase count.

18. The method as claimed in claim 11, further comprising:
  in response to the read operation corresponding to the configuration of the read threshold voltage in each entry in the read-retry table performed by the error-correction circuit indicating a failure, performing soft-decoding error correction on the page data read by the read operation using the configuration of the read threshold voltage of each entry in the read-retry table to generate corrected correct page data; and
  reporting the corrected correct page data to the host.

* * * * *